(12) United States Patent
Larson (10) Patent No.: US 6,780,770 B2
(45) Date of Patent: Aug. 24, 2004

(54) METHOD FOR STACKING SEMICONDUCTOR DIE WITHIN AN IMPLANTED MEDICAL DEVICE

(75) Inventor: Lary R. Larson, Gold Canyon, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 09/735,826

(22) Filed: Dec. 13, 2000

(65) Prior Publication Data

US 2002/0123233 A1 Sep. 5, 2002

(51) Int. Cl.[7] .................. H01L 21/302; H01L 21/3065
(52) U.S. Cl. ..................... 438/689; 438/692; 438/703; 438/712
(58) Field of Search .................. 438/689, 692, 438/703, 712, 700, 706

(56) References Cited

U.S. PATENT DOCUMENTS

| | | | |
|---|---|---|---|
| 4,862,249 A | 8/1989 | Carlson | 257/668 |
| 4,984,358 A | 1/1991 | Nelson | 438/109 |
| 5,117,282 A | 5/1992 | Salatino | 257/686 |
| 5,229,647 A | 7/1993 | Gnadinger | 257/786 |
| 5,343,366 A | 8/1994 | Cipolla et al. | 361/785 |
| 5,545,581 A * | 8/1996 | Armacost et al. | 438/631 |
| 5,808,360 A * | 9/1998 | Akram | 257/738 |
| 5,856,915 A | 1/1999 | Weinberg | 361/790 |
| 5,909,633 A * | 6/1999 | Haji et al. | 438/612 |
| 6,014,320 A | 1/2000 | Mahon et al. | 361/803 |
| 6,014,586 A | 1/2000 | Weinberg et al. | 607/36 |
| 6,051,887 A | 4/2000 | Hubbard | 257/777 |
| 6,057,175 A * | 5/2000 | Milla et al. | 438/113 |
| 6,168,973 B1 | 1/2001 | Hubbard | 438/109 |

FOREIGN PATENT DOCUMENTS

WO       9613062       5/1996       ......... H01L/21/283

* cited by examiner

*Primary Examiner*—Nadine G. Norton
*Assistant Examiner*—Lynette T. Umez-Eronini
(74) *Attorney, Agent, or Firm*—Daniel G. Chapik; Girma Wolde-Michael (57) ABSTRACT

A method for forming a stackable wafer for use in an implantable device is provided. The method comprises forming an opening extending substantially through the wafer. Thereafter, conductive material is deposited within the opening to substantially fill the opening. A bump is then formed on an upper surface of the wafer adjacent the conductive material, and a contact pad is formed on a lower surface of the wafer adjacent the conductive material. A second wafer formed using substantially the same process may then be stacked on top of the first wafer with the bump of the first wafer being in contact with the contact pad of the second wafer. A soldering process may then be used to couple the adjacent pad and wafer for physically mounting the wafers and providing electrical connectivity therebetween.

25 Claims, 5 Drawing Sheets

FIG. 5

METHOD FOR STACKING SEMICONDUCTOR DIE WITHIN AN IMPLANTED MEDICAL DEVICE

BACKGROUND OF THE INVENTION

1. Field of the Invention

This invention relates generally to a method for packaging semiconductor devices in an implantable device, and, more particularly, to a method and apparatus for providing electrical connectivity between a plurality of stacked semiconductor devices in an implantable device.

2. Description of the Related Art

Electronic devices that monitor or otherwise interact with human bodies have been in widespread use for some time now. For example, electronic devices and sensors have been routinely used to measure muscular activity. That is, electronic devices are commonly used to detect and graph electrical activity representative of a beating human heart. Electrocardiograms (EKGs), which are produced by such electronic devices, are routinely used by doctors and/or technicians as diagnostic aids to evaluate the condition of a patient's heart.

These types of electronic devices have proven to be accurate and reliable in operation, but initially were generally limited to monitoring the heart, as opposed to controlling or assisting the heart, owing principally to their size and power requirements. Outside the laboratory or hospital these electronic monitors did not prove useful in controlling the activity of the human body, such as the heart. Rather, these electronic devices became more useful in controlling or assisting in the proper operation of the heart, as they became portable, and preferably implantable within the human body.

With the development of relatively small, low-power semiconductors, implantable pacemakers became viable. As pacemakers have become more sophisticated, monitoring more functions and implementing more sophisticated control techniques, their complexity has increased dramatically. Increased functionality and complexity have lead to more complex, and thus, larger circuitry. Implantability of these devices, however, suffers with increased size. That is, smaller devices are easier to implant. Moreover, smaller implantable devices are generally more efficient to operate, have longer battery life, and are more readily accepted by the patient and doctor.

The present invention is directed to overcoming, or at least reducing the effects of, one or more of the problems set forth above.

SUMMARY OF THE INVENTION

In one aspect of the present invention, a method for forming a stackable wafer in an implantable device is provided. The method comprises forming an opening extending substantially through the wafer. Insulator material preferably of the oxide or nitride type is placed in the hole using known processes in the art. Thereafter, conductive material is deposited within the opening to substantially fill the opening. A bump is then formed on an upper surface of the wafer adjacent the conductive material, and a contact pad is formed on a lower surface of the wafer adjacent the conductive material.

In another aspect of the present invention, a method for forming a stacked arrangement of a first and second wafer in an implantable device is provided. The method comprises forming an opening extending substantially through the first wafer. Insulator material preferably of the oxide or nitride type is placed in the hole using known processes in the art. Thereafter, conductive material is deposited within the opening to substantially fill the opening in the first wafer. A bump is then formed on an upper surface of the first wafer adjacent the conductive material, and a contact pad is formed on a lower surface of the first wafer adjacent the conductive material. The method further comprises forming an opening extending substantially through the second wafer. Thereafter, conductive material is deposited within the opening to substantially fill the opening in the second wafer. A bump is then formed on an upper surface of the second wafer adjacent the conductive material, and a contact pad is formed on a lower surface of the second wafer adjacent the conductive material. The first wafer is positioned adjacent the second wafer with the bump of the first wafer being adjacent the contact pad of the second wafer. The bump of the first wafer is then coupled with the contact pad of the second wafer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
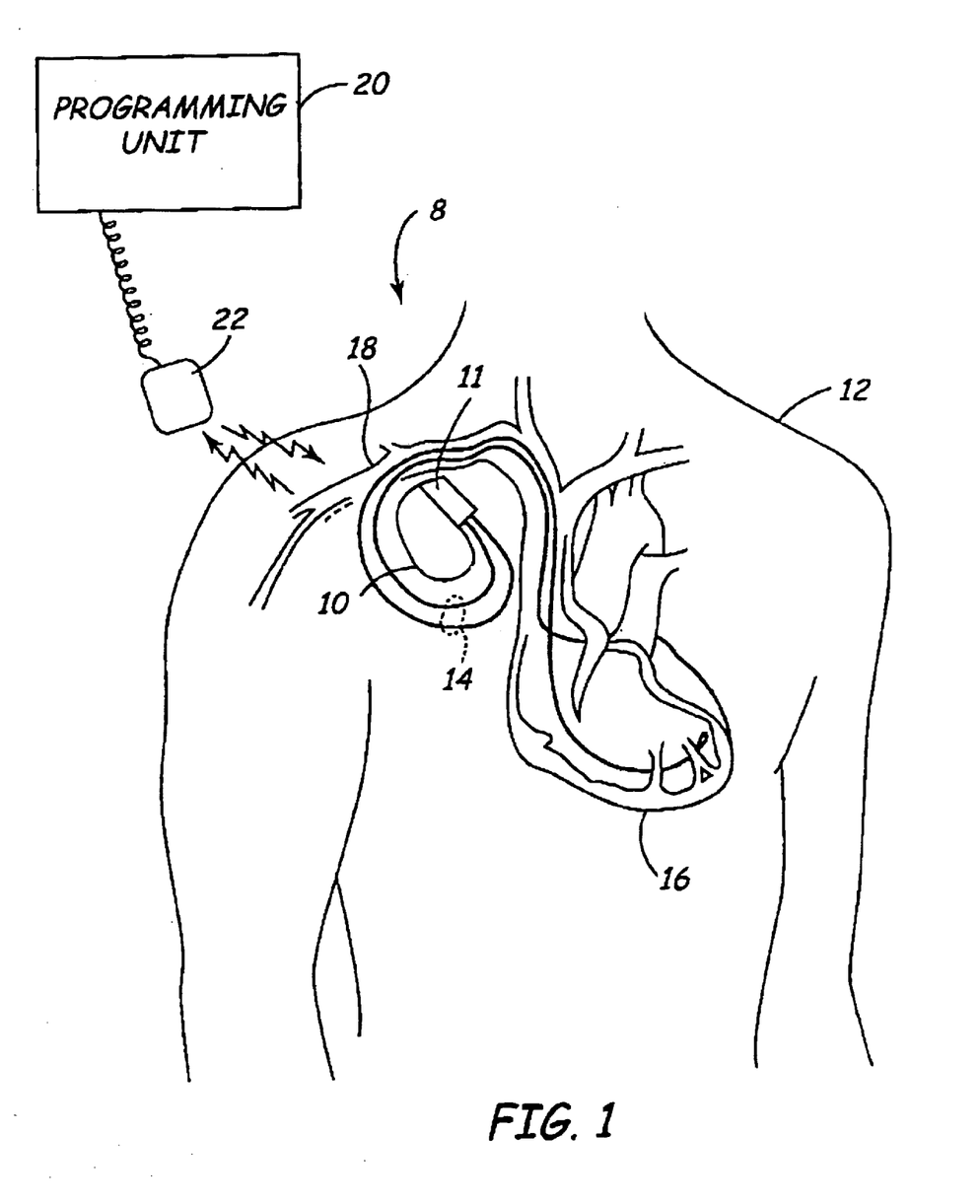
FIG. 1 schematically illustrates one embodiment of an implanted medical device in the form of a pacemaker and an associated external programming unit.

FIG. 1 illustrates an implantable medical device (IMD) system 8, which includes, for example, an implantable pacemaker 10 that has been implanted in a patient 12. The pacemaker 10 is housed within a hermetically sealed, biologically inert outer canister or housing, which may be conductive so as to serve as an electrode in the pacemaker's pacing/sensing circuit. One or more pacemaker leads, collectively identified with reference numeral 14 in FIG. 1 are electrically coupled to the pacemaker 10 in a conventional manner and extend into the patient's heart 16 via a vein 18. Disposed generally near a distal end of the leads 14 are one or more exposed conductive electrodes for receiving electrical cardiac signals or delivering electrical pacing stimuli to the heart 16. The leads 14 may be implanted with their distal end situated in either the atrium or ventricle of the heart 16.

Although the present invention is described herein in an embodiment that is useful in a pacemaker, it may be advantageously embodied in numerous other types of implantable medical device systems in which it is desirable to provide a high density integrated circuit module in a limited space.

FIG. 1 also depicts an external programming unit 20 for non-invasive communication with the implanted device 10 via conventional uplink and downlink communication channels, which are not described in greater detail herein so as to avoid unnecessarily obscuring the instant invention. Associated with the programming unit 20 is a programming head 22, in accordance with conventional medical device programming systems, for facilitating two-way communication between the pacemaker 10 and the programmer 20. In many known implantable device systems, the programming head 22, such as that depicted in FIG. 1, is positioned adjacent the patient's body over the implant site of the device 10 (usually within 2- to 3-inches of skin contact), such that one or more antennas (not shown) within the head 22 can send RF signals to, and receive RF signals from, an antenna (not shown) disposed within the hermetic enclosure of the implanted device 10 or disposed within a connector block 11 of the device 10, in accordance with common practice in the art.

Figure 2:
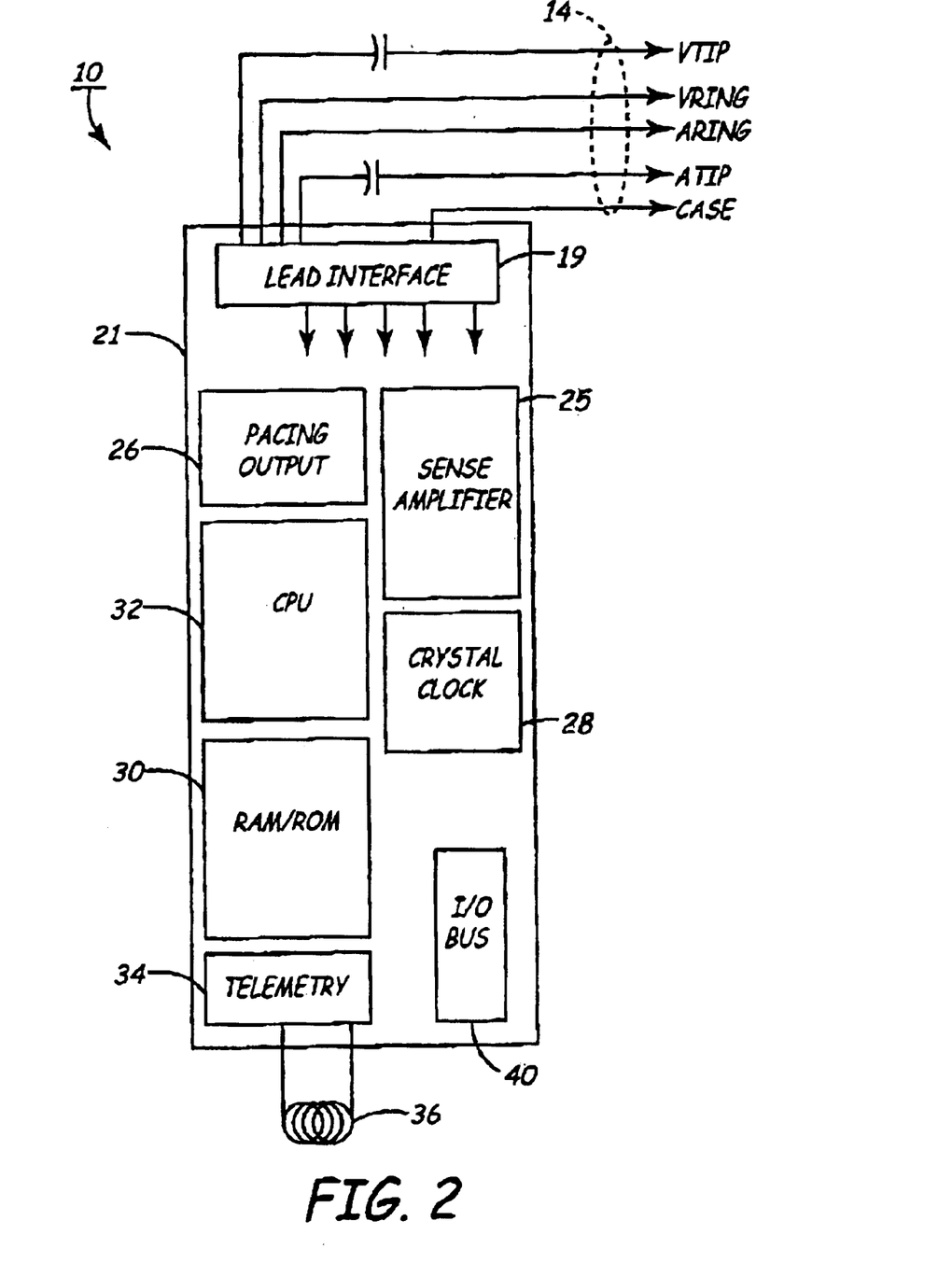
FIG. 2 schematically illustrates a high level block diagram of functional blocks of the implanted pacemaker of FIG. 1.

FIG. 2 illustrates one embodiment of a general block diagram of electronic circuitry that makes up the pacemaker 10. The pacemaker 10 is a conventional device capable of performing a variety of functions, such as delivering electrical stimulation therapy to the patient 12 in accordance with the presently disclosed embodiment of the invention. FIG. 2 shows that the pacemaker 10 comprises circuitry for controlling the device's pacing and sensing functions. Except as may be described herein, the pacemaker circuitry may be of conventional design. To the extent that certain components of the circuitry of the pacemaker 10 are conventional in their design and operation, such components are not described herein in detail, as it is believed that design and implementation of such components would be a matter of routine practice to those of ordinary skill in the art. For example, the circuitry of the pacemaker 10 shown in FIG. 2 includes sense amplifier circuitry 24, stimulating pulse output circuitry 26, a crystal clock 28, a random-access memory and read-only memory (RAM/ROM) unit 30, and a pacing timing and control circuit in the form of a programmed central processing unit (CPU) 32, all of which are well-known in the art.

The pacemaker 10 also includes an internal telemetry communications circuit 34 coupled to an antenna 36 so that it is capable of communicating with the external programmer/control unit 20. Various telemetry systems for providing the uplink and downlink communication channels between the external programming unit 20 and the implanted pacemaker 10 have been shown in the art and may be employed herein without departing from the spirit and scope of the instant invention.

With continued reference to FIG. 2, the pacemaker 10 is coupled to one or more leads 14 that, when implanted, extend transvenously between the pacemaker 10 and the patient's heart 16, as previously noted with reference to FIG. 1. Physically, the connections between the leads 14 and the various internal components of the pacemaker 10 are facilitated by the conventional connector block assembly 11 (shown in FIG. 1 but not shown in FIG. 2). Electrically, the coupling of the leads 14 and the internal electrical components of the pacemaker 10 may be facilitated by a lead interface circuit 19, which functions, in a multiplexer-like manner, to selectively and dynamically establish necessary connections between various conductors in the leads 14, including, for example, atrial tip and ring electrode conductors ATIP and ARING and ventricular tip and ring electrode conductors VTIP and VRING, and individual electrical components of the pacemaker 10, as would be familiar to those of ordinary skill in the art. For the sake of clarity, the specific connections between the leads 14 and the various components of the pacemaker 10 are not shown in FIG. 2, although it will be clear to those of ordinary skill in the art that, for example, the leads 14 will necessarily be coupled, either directly or indirectly, to sense amplifier circuitry 24 and stimulating pulse output circuitry 26, in accordance with common practice, such that sensed cardiac electrical signals may be conveyed to the sense amplifier circuitry 24, and such that stimulating pulses may be delivered to cardiac tissue, via the leads 14.

It will be appreciated that the signals received over the leads 14 by the sense amplifier circuitry 24 may be collected and stored in the RAM/ROM unit 30 by the CPU 32 acting under control of software also stored in the RAM/ROM unit 30. Additional data, such as the timing of signals delivered by the stimulating pulse output circuitry 26 may also be stored in the RAM/ROM unit 30. This stored data may be later retrieved and delivered to the programming unit 20 via the telemetry communications circuit 34.

It is to be understood that the various components of the pacemaker 10 depicted in FIG. 2 are powered by means of a battery (not shown), which is contained within the hermetic enclosure of the pacemaker 10, in accordance with common practice in the art. For the sake of clarity in the drawings, the battery and the connections between it and the other components of the pacemaker 10 are not shown.

The stimulating pulse output circuitry 26 functions to generate cardiac stimuli under control of signals issued by the CPU 32.

Generally, the sense amplifier circuitry 24 functions to receive electrical cardiac signals from the leads 14 and to process such signals to derive event signals reflecting the occurrence of specific cardiac electrical events, including atrial contractions (P-waves) and ventricular contractions (R-waves). These event-indicating signals are provided to the CPU 32 for use by the CPU 32 in controlling the synchronous stimulating operations of the pacemaker 10 in accordance with common practice in the art. In addition, these event-indicating signals, as discussed above, may be stored in the RAM/ROM unit 30 and/or communicated, via the uplink communication channel, to the external programming unit 20 for storage and visual display to a physician or clinician. Again, however, it is believed that those of ordinary skill in the art could select from among many various types of prior art pacing output circuits, which would be suitable for the purposes of practicing the present invention.

Those of ordinary skill in the art will appreciate that the pacemaker 10 may include numerous other components and subsystems, for example, activity sensors and associated circuitry. The presence or absence of such additional components in the pacemaker 10, however, is not believed to be pertinent to the present invention, which relates generally to the programming unit 20 and its methods of operation.

Figure 3:
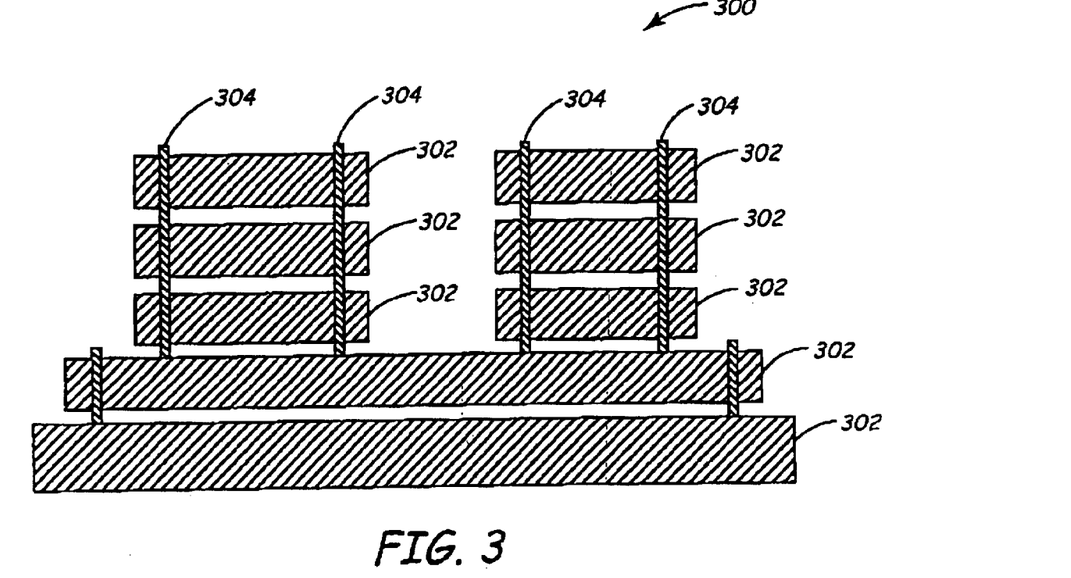
FIG. 3 illustrates one embodiment of a side view of a plurality of semiconductor die used in the pacemaker of FIG. 1.

Some or all of the circuitry illustrated in block diagram form in FIG. 2 is constructed on one or more semiconductor die, which in one embodiment illustrated in FIG. 3 is shown in a high-density stacked arrangement or semiconductor module 300. FIG. 3 shows a side view of one embodiment of the stacked arrangement 300. The stacked arrangement 300 provides a high-density arrangement of the semiconductor die of the pacemaker 10 so that it is compact in size and configuration. Moreover, the compact arrangement 300 provides for electrically conductive paths between the semiconductor die that are relatively short in length, allowing for relatively high-speed communications therebetween, minimizing resistance associated with these conductive paths and thereby decreasing power consumed by the pacemaker 10 and increasing its useful battery life. The instant invention provides a semiconductor module used to control the operation of an implantable pacemaker that is compact in size, easing the process used to implant the pacemaker 10 within a patient.

FIG. 3 illustrates a plurality of die 302 stacked in one exemplary arrangement. Those skilled in the art will appreciate that any of a variety of arrangements may be constructed without departing from the spirit and scope of the instant invention. In the illustrated embodiment, the die 302 may take the form of any of a variety of semiconductor devices, such as a microprocessor, memory, interface circuitry, and the like. In the illustrated embodiment of FIG. 3, the die 302 are stacked upon one another, and physically and electrically coupled together via conductive paths 304. Generally, a plurality of the electrical paths 304 may be provided, extending through one or more of the die 302. As discussed in more detail below, portions of the electrical paths 304 may be constructed during the manufacture of the individual die 302. Thereafter, the die 304 may be stacked into the appropriate configuration and the portions of the electrical paths 304 may be physically and electrically joined together, such as by soldering, bonding, or the like.

Turning now to FIGS. 4A–4E, one exemplary method that may be employed to form the electrical paths 304 is illustrated. Beginning with FIG. 4A, a wafer 400, which may be comprised of a semiconductor substrate, a partially formed semiconductor die, or even a relatively complete semiconductor die, has a mask 402 formed thereabove. The mask 402 may take on the form of any of a variety of masks conventionally used in the manufacture of semiconductor devices. For example, the mask 402 may be a photoresist material that is applied, exposed and processed in well-known fashion to form the mask 402. Openings 404 are formed in the mask 402 to expose a portion of the underlying wafer 400 in a region that corresponds to the region in which the electrically conductive paths 304 are to be formed. The wafer 400 and mask 402 are exposed to an etching process, such as a reactive ion etching (RIE) process represented by the arrows 406.

Figure 4A:
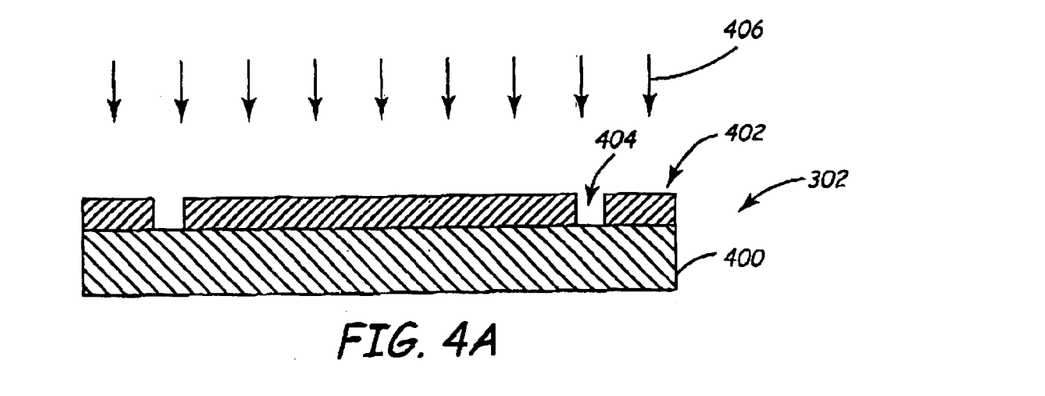
FIGS. 4A–4D illustrate cross sectional side view of a wafer at various stage of manufacture of a conductive channel.
Figure 4B:
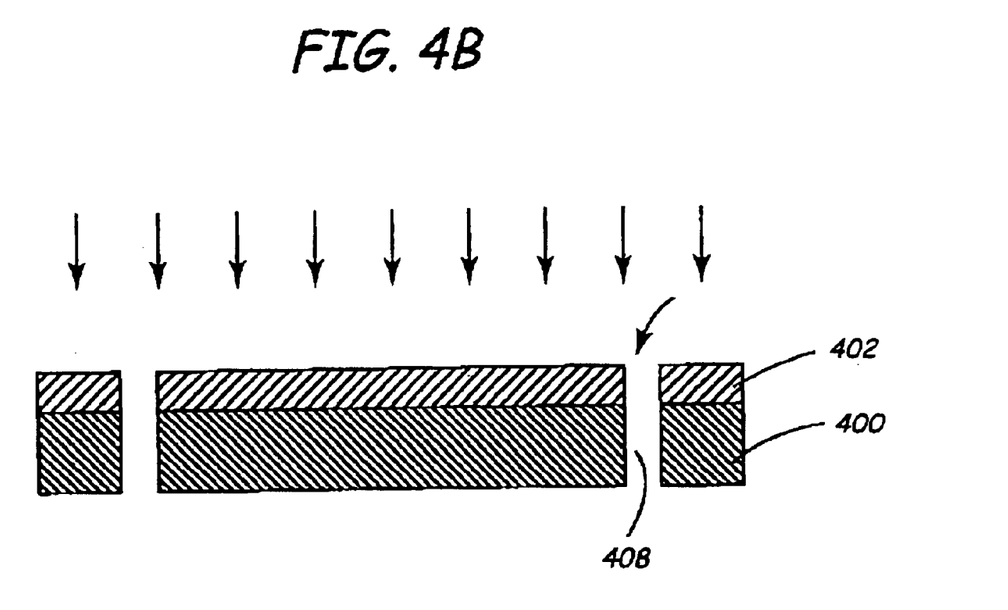

The RIE process reacts with the exposed portions of the wafer 400 to systematically etch away the material underlying the openings 402. The process is continued for a sufficient duration of time to allow the etching process to extend substantially through the wafer 400, as shown in FIG. 4B. It will be appreciated by those skilled in the field of semiconductor processing that the etching process may be comprised of one or more processes, depending on the types of materials exposed as the etching process removes material from the wafer 400. That is, the wafer 400 may be comprised of a plurality of layers of materials, which may respond differently when exposed to the etching processes. Thus, it may be useful to tailor the etching process to the physical characteristics of the various layers present in the wafer 400.

Figure 4C:
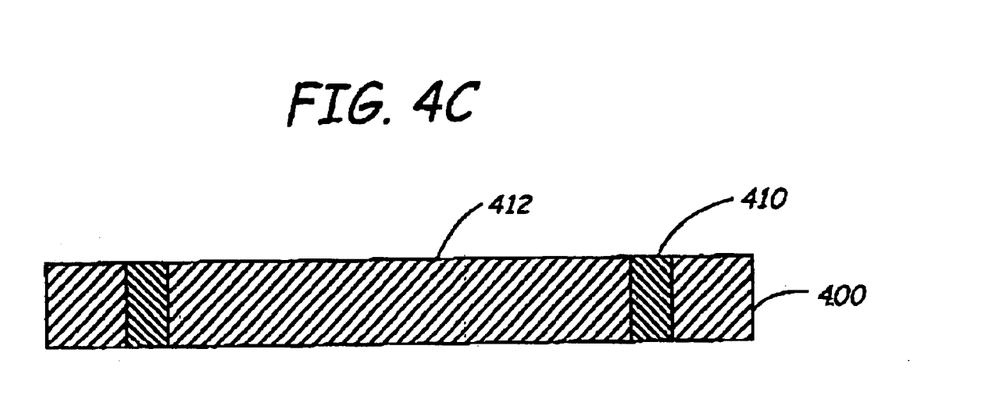

After the etching process has produced openings 408 extending substantially through the wafer 400, the mask 402 may be removed, such as by rinsing, polishing, grinding, ashing, or the like. Insulator material preferably of the oxide or nitride type is placed in the hole using known processes in the art. Thereafter, as shown in FIG. 4C, the openings 408 may be substantially filled by a conductive material 410 to provide at least a portion of the electrical paths 304. The conductive material 410 may be formed in the openings 408 by any of a variety of processes without departing from the spirit and scope of the instant invention. For example, a layer of conductive material (not shown) may be deposited or otherwise formed on a surface 412 of the wafer 400. The conductive material may be deposited to a thickness to ensure that the openings 408 are filled or overfilled. Thereafter, any excess conductive material may be removed from the surface 412 by grinding, polishing, or the like to leave the conductive material substantially exclusively in the openings 408. In one embodiment, excess conductive material 410 overlying the surface 412 of the wafer 400 is removed using a chemical mechanical polishing (CMP) technique well known to those skilled in the art of semiconductor manufacturing. Although FIGS. 4A–4D appear to illustrate the formation of two openings through the wafer, in reality, many such openings may be formed simultaneously through selected regions of the wafer to accomplish the desired connectively, as will be discussed more fully below.

The conductive material may take on any of a wide variety of forms without departing from the spirit and scope of the instant invention. For example, the conductive material 410 may be comprised of copper, aluminum, tungsten, nickel, some combination thereof, or the like. Moreover, the conductive material may be formed using any of a variety of techniques, including sputtering, electrodeposition, electroplating, and the like. Additionally, barrier layers may also be formed on the surface 412 and within the openings 408 to ensure good adhesion between the wafer 400 and the conductive material 410, such as when copper is used as the conductive material 410.

Figure 4D:
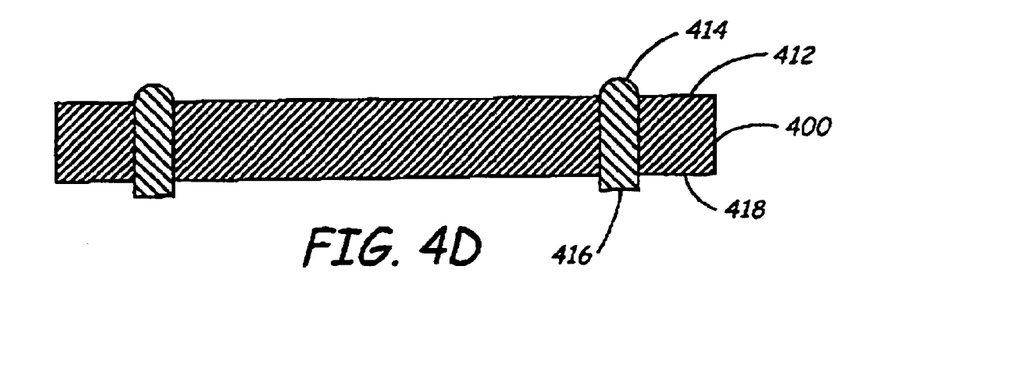

Thereafter, as shown in FIG. 4D, bumps 414 and conductive pads 416 are formed adjacent the conductive material 410, extending beyond the surface 412 and a surface 418 of the wafer 400. The bumps 414 and conductive pads 416 may be comprised of a variety of conductive materials that are wettable or otherwise suitable for soldering. For example, the bumps 414 and conductive pads 416 may be comprised of, for example, copper, nickel, lead, tin, or the like.

Figure 5:
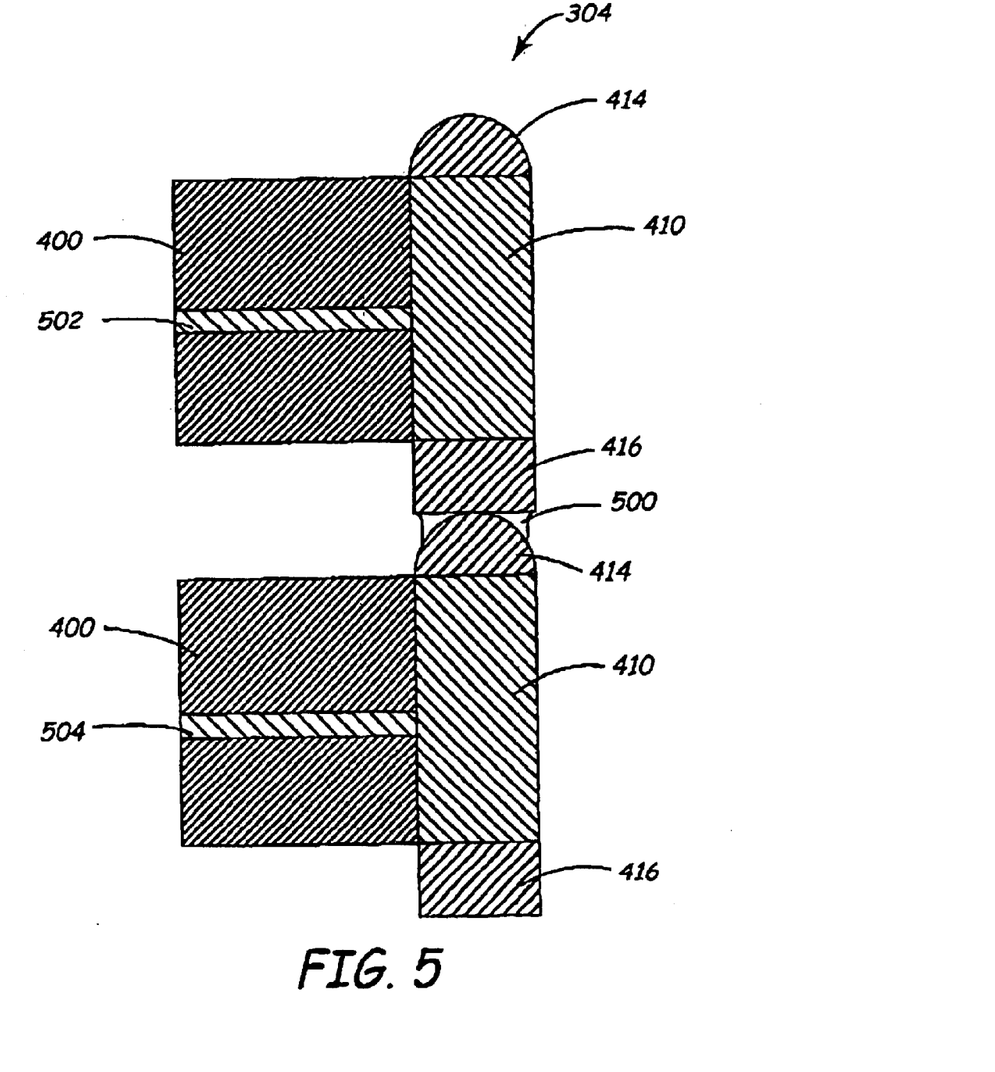
FIG. 5 illustrates a cross sectional side view of two of the wafers of FIGS. 4A–4D in a stacked arrangement.

Assembly of the completed wafer 400 into the stacked arrangement 300 is illustrated in greater detail in FIG. 5. A portion of two of the wafers 400 are illustrated in the stacked arrangement 300 with the pad 416 of the upper wafer 400 resting on the bump 414 of the lower wafer 400. A soldering process has formed a solder joint 500 to fixedly couple the upper wafer pad 416 to the lower wafer bump 414 to form the conductive path 304. Conductive layers 502, 504 have been stylistically represented within the upper and lower wafers 400, respectively. The conductive layers 502, 504 are in electrical contact with the conductive material 410 so that they are coupled together via the conductive channel 304. Thus, an electrical signal delivered to the conductive layer 502 is also communicated to the conductive layer 504 via the conductive channel 304.

Those skilled in the art of semiconductor design and manufacturing will appreciate that a wafer 400 may be comprised of many conductive layers 502, 504. Selected ones of the conductive layers 502, 504 may be coupled to its own associated conductive paths 304. Thus, any of a variety of electrical signals generated in one of the wafers 400 may be delivered to one or more of the other wafers 400. It should also be appreciated that some of the conductive paths 304 need not be coupled to a conductive layer within the wafer 400. For example, where more than two wafers 400 are stacked together, there may be a need for the top wafer 400 to pass a signal to the bottom wafer 400, but not the intermediate wafer 400. Thus, while the conductive path may pass through the intermediate wafer 400, it need not be coupled to any conductive layer in the intermediate wafer 400.

While the instant invention has been illustrated via an RIE process to produce an opening 408 in the wafer 400, those skilled in the art of semiconductor manufacturing techniques will appreciate that any of a wide variety of etching processes may be employed to produce the openings 408. Moreover, the openings 408 may be created at any time during the manufacturing process of the wafer 400. That is, the openings 408 may be formed near the end of the manufacturing process when, for example, the wafer 400 is substantially complete. Alternatively, the openings 408 may be formed near the beginning of the manufacturing process when, for example, the wafer 400 has just begun the manufacturing process and is still comprised mainly of a substrate. When the openings 408 are near the beginning of the manufacturing process, the openings 408 may be formed of such an aspect ratio (height-to-width) that subsequent process steps will not unduly fill the openings 408. Then, subsequent to filling the openings 408 with conductive material, the openings 408 may be cleared of any undesirable materials, or those materials may be allowed to remain, as desired.

The conductive paths 304 may be used to distribute any of a wide variety of electrical signals between the various die 302 in the stacked arrangment 300. For example, addresses, data, and control signals may be delivered between the die 302. Additionally, preselected voltages, such as system voltage and system ground may also be delivered between the die 302 via the conductive paths 304. It should be appreciated that relatively few or relatively many conductive paths 304 may be created between the various die, as dictated by the needs of the system being implemented.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below. Accordingly, the protection sought herein is as set forth in the claims below.

What is claimed is:

1. A method for forming a stackable wafer in an implantable device, comprising:

forming an opening extending substantially through the wafer;

depositing conductive material within the opening to substantially fill the opening;

forming a bump on and extending outward from an upper surface of the wafer adjacent the conductive material; and forming a contact pad on and extending outward from a lower surface of the wafer adjacent the conductive material.

2. The method set forth in claim 1, wherein forming an opening further comprises exposing a selected portion of the upper surface of the wafer to a reactive ion etching process for a preselected duration of time.

3. The method set forth in claim 1, wherein depositing conductive material within the opening further comprises depositing at least one of copper, tungsten, nickel, and aluminum within the opening.

4. The method set forth in claim 1, wherein depositing conductive material within the opening further comprises depositing a layer of conductive material over the upper surface of the wafer and within the opening, and removing a portion of the layer of conductive material overlying the upper surface of the wafer.

5. The method set forth in claim 4, wherein removing a portion of the layer of conductive material further comprises performing a chemical mechanical polishing of the layer of conductive material to remove a portion of the layer of conductive material overlying the upper surface of the wafer.

6. The method of claim 1, wherein forming a bump on an upper surface of the wafer further comprises forming a bump wherein at least a portion of a surface of the bump is wettable.

7. The method of claim 1, wherein forming a contact pad on a lower surface of the wafer further comprises forming a contact pad wherein at least a portion of a surface of the contact pad is wettable.

8. The method of claim 1, wherein forming an opening extending substantially through the wafer further comprises forming the opening extending substantially through a substrate of the wafer.

9. The method of claim 8, wherein forming an opening extending substantially through the wafer further comprises forming the opening extending substantially through a substrate of the wafer and any additional process layers formed on the substrate.

10. The method set forth in claim 1, wherein depositing conductive material within the opening further comprises depositing conductive material in contact with at least one conductive layer disposed within the wafer.

11. A method for forming a stacked arrangement of a first and second wafer in an implantable device, comprising:

forming an opening extending substantially through the first wafer;

depositing conductive material within the opening to substantially fill the opening in the first wafer;

forming a bump on an upper surface of the first wafer adjacent the conductive material;

forming a contact pad on a lower surface of the first wafer adjacent the conductive material;

forming an opening extending substantially through the second wafer, depositing conductive material within the opening to substantially fill the opening in the second wafer;

forming a bump on an upper surf ace of the second wafer adjacent the conductive material;

forming a contact pad on a lower surface of the second wafer adjacent the conductive material;

positioning the first water adjacent the second wafer with the bump of the first wafer being adjacent the contact pad of the second wafer; and coupling the bump of the first wafer with the contact pad of the second wafer.

12. The method set forth in claim 11, wherein coupling the bump of the first wafer with the contact pad of the second wafer further comprises soldering the bump of the first wafer with the contact pad of the second wafer.

13. The method set forth in claim 11, wherein forming an opening in the first wafer further comprises exposing a selected portion of the upper surface of the first wafer to a reactive ion etching process for a preselected duration of time.

14. The method set forth in claim 11, wherein depositing conductive material within the opening of the first wafer further comprises depositing at least one of copper, tungsten, nickel, and aluminum within the opening of the first wafer.

15. The method set forth in claim 11, wherein depositing conductive material within the opening of the first wafer further comprises depositing a layer or conductive material over the upper surface of the first wafer and within the opening, and removing a portion of the layer of conductive material overlying the upper surface of the first wafer.

16. The method set forth in claim 15, wherein removing a portion of the layer of conductive material further comprises performing a chemical mechanical polishing of the layer of conductive material to remove a portion of the layer of conductive material overlying the upper surface of the first wafer.

17. The method of claim 11, wherein forming a bump on an upper surface of the first wafer further comprises forming a bump wherein at least a portion of a surface of the bump is wettable.

18. The method of claim 11, wherein forming a contact pad on a lower surface of the second wafer further comprises forming a contact pad wherein at least a portion of a surface of the contact pad is wettable.

19. The method of claim 11, wherein forming an opening extending substantially through the firs wafer further comprises forming the opening extending substantially through a substrate of the first wafer.

20. The method of claim 19, wherein forming an opening extending substantially through the first wafer further comprises forming the opening extending substantially through the substrate of the first wafer and any additional process layers formed on the substrate.

21. The method set forth in claim 11, wherein depositing conductive material within the opening of the first wafer further comprises depositing conductive material in contact with at least one conductive layer disposed within the first wafer.

22. A method for forming a stackable wafer for use in an implantable medical device, comprising:

providing a housing;

mounting a semiconductor module inside the housing, wherein said semiconductor module includes first and second semiconductor die in a stacked arrangement, the stacked semiconductor die having circuitry implementing an operational implantable medical device function; and providing a plurality of electrical connections extending between the die, each electrical connection comprising an interconnection between a bump on an upper surface that extends outward from the upper surface of the first die and a contact pad on a lower surface that extends outward from the lower surface of the second die.

23. The method of claim 22 further comprises a solder connection that is provided for the interconnection between a bump on an upper surface of the first die and a contact pad on a lower surface of the second die.

24. The method of claim 22 further comprises delivering electrical stimulation therapy via said circuitry.

25. The method of claim 22 wherein an operational implantable medical device function further comprises pacing and sensing functions that are implemented by the circuitry.

* * * * *